US006647773B2

(12) United States Patent
Nantz et al.

(10) Patent No.: US 6,647,773 B2
(45) Date of Patent: Nov. 18, 2003

(54) SYSTEM AND METHOD FOR INTEGRATED TIRE PRESSURE MONITORING AND PASSIVE ENTRY

(75) Inventors: John S. Nantz, Brighton, MI (US); Qingfeng Tang, Novi, MI (US); Riad Ghabra, Dearborn Heights, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/193,418

(22) Filed: Jul. 11, 2002

(65) Prior Publication Data

US 2003/0164032 A1 Sep. 4, 2003

Related U.S. Application Data

(60) Provisional application No. 60/360,762, filed on Mar. 1, 2002.

(51) Int. Cl.[7] .............................................. B60C 23/04
(52) U.S. Cl. ...................................................... 73/146.5
(58) Field of Search ................................ 152/152.1, 64, 152/539; 340/426, 425.5, 428, 431, 442–447, 452, 539; 701/29, 124; 73/146, 146.2, 146.3, 146.4, 146.5

(56) References Cited

U.S. PATENT DOCUMENTS

| | | | |
|---|---|---|---|
| 3,580,353 A | 5/1971 | Thompson |
| 3,916,688 A | 11/1975 | Dendy et al. |
| 4,067,235 A | 1/1978 | Markland et al. |
| 4,101,870 A | 7/1978 | Ekman |
| 4,330,774 A | 5/1982 | Doty |
| 4,450,431 A | 5/1984 | Hochstein |
| 4,468,650 A | 8/1984 | Barbee |
| 4,570,152 A | 2/1986 | Melton et al. |
| 4,660,528 A | 4/1987 | Buck |
| 4,670,845 A | 6/1987 | Etoh |
| 4,717,905 A | 1/1988 | Morrison, Jr. et al. |
| 4,749,993 A | 6/1988 | Szabo et al. |
| 4,951,208 A | 8/1990 | Etoh |
| 5,040,561 A | 8/1991 | Achterholt |
| 5,109,213 A | 4/1992 | Williams |
| 5,156,230 A | 10/1992 | Washburn |
| 5,165,497 A | 11/1992 | Chi |
| 5,289,160 A | 2/1994 | Fiorletta |
| 5,444,448 A | 8/1995 | Schuermann et al. |
| 5,451,959 A | 9/1995 | Schuermann |
| 5,461,385 A | 10/1995 | Armstrong |
| 5,463,374 A | 10/1995 | Mendez et al. |
| 5,473,938 A | 12/1995 | Handfield et al. |
| 5,479,171 A | 12/1995 | Schuermann |
| 5,483,827 A | 1/1996 | Kulka et al. |
| 5,485,381 A | 1/1996 | Heintz et al. |
| 5,500,637 A | 3/1996 | Kokubu |
| 5,562,787 A | 10/1996 | Koch et al. |
| 5,573,610 A | 11/1996 | Koch et al. |
| 5,573,611 A | 11/1996 | Koch et al. |
| 5,585,554 A | 12/1996 | Handfield et al. |

(List continued on next page.)

*Primary Examiner*—William Oen
(74) *Attorney, Agent, or Firm*—Bill C. Panagos

(57) ABSTRACT

A system and method for remote monitoring of vehicle tire pressure include monitors in each tire to transmit signals representative of tire pressure and receive control signals for use in regulating transmission of the tire pressure signals. A vehicle receiver receives the tire pressure signals and passive entry signals transmitted by a remote passive entry device. A vehicle transmitter transmits the control signals for use in regulating transmission of the tire pressure signals. A controller on-board the vehicle in communication with the receiver and transmitter conveys tire pressure information to a vehicle occupant based on the tire pressure signals, determines whether the vehicle is occupied based on the passive entry signal, and generates a control signal operative to halt transmission of the tire pressure signals when the vehicle is unoccupied.

20 Claims, 2 Drawing Sheets

U.S. PATENT DOCUMENTS

| | | |
|---|---|---|
| 5,600,301 A | 2/1997 | Robinson, III |
| 5,602,524 A | 2/1997 | Mock et al. |
| 5,654,689 A | 8/1997 | Peyre et al. |
| 5,661,651 A | 8/1997 | Geschke et al. |
| 5,677,667 A | 10/1997 | Lesesky et al. |
| 5,705,746 A | 1/1998 | Trost et al. |
| 5,717,376 A | 2/1998 | Wilson |
| 5,724,028 A | 3/1998 | Prokup |
| 5,728,933 A | 3/1998 | Schultz et al. |
| 5,740,548 A | 4/1998 | Hudgens |
| 5,741,966 A | 4/1998 | Handfield et al. |
| 5,753,809 A | 5/1998 | Ogusu et al. |
| 5,760,682 A | 6/1998 | Liu et al. |
| 5,774,047 A | 6/1998 | Hensel, IV |
| 5,783,992 A | 7/1998 | Eberwine et al. |
| 5,822,683 A | 10/1998 | Paschen |
| 5,835,868 A | 11/1998 | McElroy et al. |
| 5,838,229 A | 11/1998 | Robinson, III |
| 5,844,130 A | 12/1998 | Hilgart et al. |
| 5,853,020 A | 12/1998 | Widner |
| 5,880,363 A | 3/1999 | Meyer et al. |
| 5,900,808 A | 5/1999 | Lebo |
| 5,926,087 A | 7/1999 | Busch et al. |
| 5,939,977 A | 8/1999 | Monson |
| 5,942,971 A | 8/1999 | Fauci et al. |
| 5,959,365 A | 9/1999 | Mantini et al. |
| 5,963,128 A | 10/1999 | McClelland |
| 5,999,091 A | 12/1999 | Wortham |
| 6,002,327 A | 12/1999 | Boesch et al. |
| 6,025,777 A | 2/2000 | Fuller et al. |
| 6,034,596 A | 3/2000 | Smith et al. |
| 6,034,597 A | 3/2000 | Normann et al. |
| 6,043,738 A | 3/2000 | Stewart et al. |
| 6,043,752 A | 3/2000 | Hisada et al. |
| 6,053,038 A | 4/2000 | Schramm et al. |
| 6,060,984 A | 5/2000 | Braun et al. |
| 6,087,930 A | 7/2000 | Kulka et al. |
| 6,111,520 A | 8/2000 | Allen et al. |
| 6,112,587 A | 9/2000 | Oldenettel |
| 6,118,369 A | 9/2000 | Boesch |
| 6,127,939 A | 10/2000 | Lesesky et al. |
| 6,169,480 B1 | 1/2001 | Uhl et al. |
| 6,175,302 B1 | 1/2001 | Huang |
| 6,181,241 B1 | 1/2001 | Normann et al. |
| 6,204,758 B1 | 3/2001 | Wacker et al. |
| 6,232,875 B1 | 5/2001 | DeZorzi |
| 6,232,884 B1 | 5/2001 | Gabbard |
| 6,243,007 B1 | 6/2001 | McLaughlin et al. |
| 6,246,317 B1 | 6/2001 | Pickornik et al. |
| 6,252,498 B1 | 6/2001 | Pashayan, Jr. |
| 6,255,940 B1 | 7/2001 | Phelan et al. |
| 6,259,361 B1 | 7/2001 | Robillard et al. |
| 6,259,362 B1 | 7/2001 | Lin |
| 6,275,148 B1 | 8/2001 | Takamura et al. |
| 6,278,363 B1 | 8/2001 | Bezek et al. |
| 6,304,610 B1 | 10/2001 | Monson |
| 6,340,929 B1 | 1/2002 | Katou et al. |
| 6,408,690 B1 | 6/2002 | Young et al. |
| 6,417,766 B1 | 7/2002 | Starkey |
| 6,501,372 B2 | 12/2002 | Lin |
| 2001/0008083 A1 | 7/2001 | Brown |

SYSTEM AND METHOD FOR INTEGRATED TIRE PRESSURE MONITORING AND PASSIVE ENTRY

CROSS REFERENCE TO RELATED APPLICATION

This application claims the benefit of U.S. provisional application Ser. No. 60/360,762, filed Mar. 1, 2002.

BACKGROUND OF THE INVENTION

1. Field of the Invention

The present invention relates to a system and method for integrated tire pressure monitoring and vehicle passive entry.

2. Background

It is known in the automotive industry to provide for wireless monitoring of vehicle tire parameters, particularly tire pressure. In such tire pressure monitoring systems, monitors which typically include pressure sensors and radio frequency (RF) transmitters are mounted inside each tire, usually adjacent the inflation valve stem. In each tire, the tire pressure sensed by the tire pressure sensor is transmitted by the transmitter to a receiver/controller located on-board the vehicle. The tire pressure information delivered to the receiver/controller by the RF signals from the transmitters is subsequently conveyed to a vehicle operator or occupant, typically in the form of a display. Exemplary tire pressure monitoring systems are described and shown in U.S. Pat. Nos. 6,112,587 and 6,034,597.

It is also known in the automotive industry to provide for remote vehicle access, such as through the use of remote keyless entry (RKE) systems. Such RKE systems typically use a hand-held remote transmitter, which is commonly referred to as a "fob" or "card." Currently available RKE fobs may be separate units, or may be part of an ignition key head. Such RKE fobs generally transmit radio frequency (RF) signals to a vehicle in order to lock or unlock vehicle doors, open or close a vehicle sliding door, unlock a vehicle trunk, activate internal and/or external vehicle lights, activate a "panic" alarm, and/or perform a variety of other functions.

RKE systems may be characterized as active or passive systems. In active RKE systems, a switch or pushbutton on the remote transmitter must be activated by an operator in order to have a desired remote access function performed, such as locking or unlocking the vehicle doors. In passive RKE systems, however, no such switch or pushbutton activation by an operator is required in order to perform a desired remote access function.

More specifically, in a passive RKE system, a remote transponder, which again may be referred to as a "fob" or a "card," is typically provided for communicating with a transponder and/or control unit installed in the vehicle. The vehicle transponder and/or control unit is provided in communication with door locking mechanisms to lock and unlock the vehicle doors in response to lock or unlock signals received from the remote transponder within some pre-defined range. In that regard, the remote transponder is carried by an operator and is designed to automatically unlock the vehicle as the operator approaches the vehicle, without the need for operation of any switch or pushbutton by the operator. Similarly, the system is further designed to automatically lock the vehicle as the operator, carrying the remote transponder, moves away from the vehicle.

Exemplary passive entry systems for vehicles are described in U.S. Pat. No. 4,873,530 issued to Takeuchi et al. and entitled "Antenna Device In Automotive Keyless Entry System;" U.S. Pat. No. 4,942,393 issued to Waraksa et al. and entitled "Passive Keyless Entry System;" U.S. Pat. No. 5,499,022 issued to Boschini and entitled "Remote Control System For Locking And Unlocking Doors And Other Openings In A Passenger Space, In Particular In A Motor Vehicle;" U.S. Pat. No. 5,751,073 issued to Ross and entitled "Vehicle Passive Keyless Entry And Passive Engine Starting System;" U.S. Pat. No. 6,049,268 issued to Flick and entitled "Vehicle Remote Control System With Less Intrusive Audible Signals And Associated Methods;" and U.S. Pat. No. 6,236,333 issued to King and entitled "Passive Remote Keyless Entry System."

Such prior art tire pressure monitoring and passive entry systems, however, are independent, distinct systems. That is, such systems do not interact with one another or share components. In that regard, the use of passive entry information for regulating tire pressure monitoring would improve operational efficiency. Such a system and method would also preferably integrate tire pressure monitoring and vehicle passive entry, such as through the use of shared, combined or integrated components, thereby reducing cost.

SUMMARY OF THE INVENTION

Accordingly, the present invention provides a system and method for integrated tire pressure monitoring and vehicle passive entry.

According to the present invention, then, a system is provided for remote monitoring of tire pressure in a vehicle having a plurality of tires. The system comprises a plurality of tire monitors, each monitor for mounting in one of the plurality of tires to monitor tire pressure. Each monitor comprises a transponder for transmitting a signal representative of the tire pressure and for receiving a control signal for use in regulating transmission of the tire pressure signal. The system further comprises a receiver for mounting on-board the vehicle for receiving the tire pressure signals transmitted by the transponders and for receiving a passive entry signal transmitted by a remote passive entry device, and a transmitter for mounting on-board the vehicle for transmitting to the transponders the control signal for use in regulating transmission of the tire pressure signals. The system still further comprises a controller for mounting on-board the vehicle and to be provided in communication with the receiver and the transmitter. The controller is for conveying tire pressure information to a vehicle occupant based on the tire pressure signals, determining whether the vehicle is occupied based on the passive entry signal, and generating the control signal for use in regulating transmission of the tire pressure signals. The control signal is operative to halt transmission of the tire pressure signals by the transponders when the vehicle is unoccupied.

Also according to the present invention, another system is provided for remote monitoring of tire pressure in a vehicle having a plurality of tires. The system comprises a plurality of tire monitors, each monitor for mounting in one of the plurality of tires to monitor tire pressure. Each monitor comprises a transponder for transmitting a signal representative of the tire pressure and for receiving a control signal operative to regulate transmission of the tire pressure signal. The system further comprises at least one receiver for mounting on-board the vehicle for receiving the tire pressure signals transmitted by the transponders and for receiving a passive entry signal transmitted by a remote passive entry device. The system still further comprises a controller for mounting on-board the vehicle and to be provided in communication with the at least one receiver, the controller for conveying tire pressure information to a vehicle occupant based on the tire pressure signals, determining whether the vehicle is occupied based on the passive entry signal, and generating the control signal for use in regulating transmission of the tire pressure signals. The control signal is operative to halt transmission of the tire pressure signals by the transponders when the vehicle is unoccupied.

Still further according to the present invention, a method is provided for monitoring tire pressure in a vehicle having a plurality of tires. The method comprises transmitting from a tire a signal representative of a tire pressure, and receiving at the tire a control signal for use in regulating transmission of the tire pressure signal. The method further comprises receiving at the vehicle the tire pressure signal and a passive entry signal, and conveying tire pressure information to a vehicle occupant based on the tire pressure signal. The method still further comprises determining whether the vehicle is occupied based on the passive entry signal, and transmitting from the vehicle the control signal for use in regulating transmission of the tire pressure signal, wherein the control signal is operative to halt transmission of the tire pressure signal when the vehicle is unoccupied.

These and other features and advantages of the present invention will be readily apparent upon consideration of the following detailed description of the invention in conjunction with the accompanying drawings.

DETAILED DESCRIPTION OF THE PREFERRED EMBODIMENTS

Referring now to the Figures, the preferred embodiments of the present invention will now be described in detail. As previously noted, it is known in the automotive industry to provide for wireless monitoring of vehicle tire parameters, particularly tire pressure. In such tire pressure monitoring systems, monitors which typically include pressure sensors and RF transmitters are mounted inside each tire, usually adjacent the inflation valve stem. In each tire, the tire pressure sensed by the tire pressure sensor is transmitted by the transmitter to a receiver/controller located on-board the vehicle. The tire pressure information delivered to the receiver/controller by the RF signals from the transmitters is subsequently conveyed to a vehicle operator or occupant, typically in the form of a display.

As also noted above, it is also known in the automotive industry to provide for passive remote vehicle access, such as through the use of RKE systems. In a passive RKE system, a remote transponder transmits RF signals to a vehicle in order to lock or unlock vehicle doors. The remote transponder communicates with a control unit installed in the vehicle. The vehicle control unit is provided in communication with door locking mechanisms to lock and unlock the vehicle doors in response to lock or unlock signals received from the remote transponder within some predefined range. The remote transponder is carried by an operator and automatically unlocks the vehicle as the operator approaches the vehicle, without the need for operation of any switch or pushbutton by the operator. Similarly, the system is further designed to automatically lock the vehicle as the operator, carrying the remote transponder, moves away from the vehicle.

Once again, however, such prior art tire pressure monitoring and passive entry systems are independent, distinct systems. That is, such systems do not interact with one another or share components. The present invention provides a system and method wherein passive entry information is utilized for regulating tire pressure monitoring, thereby improving operational efficiency. The system and method of the present invention also preferably integrate tire pressure monitoring and vehicle passive entry, such as through the use of shared, combined or integrated components, thereby reducing cost.

Figure 1:
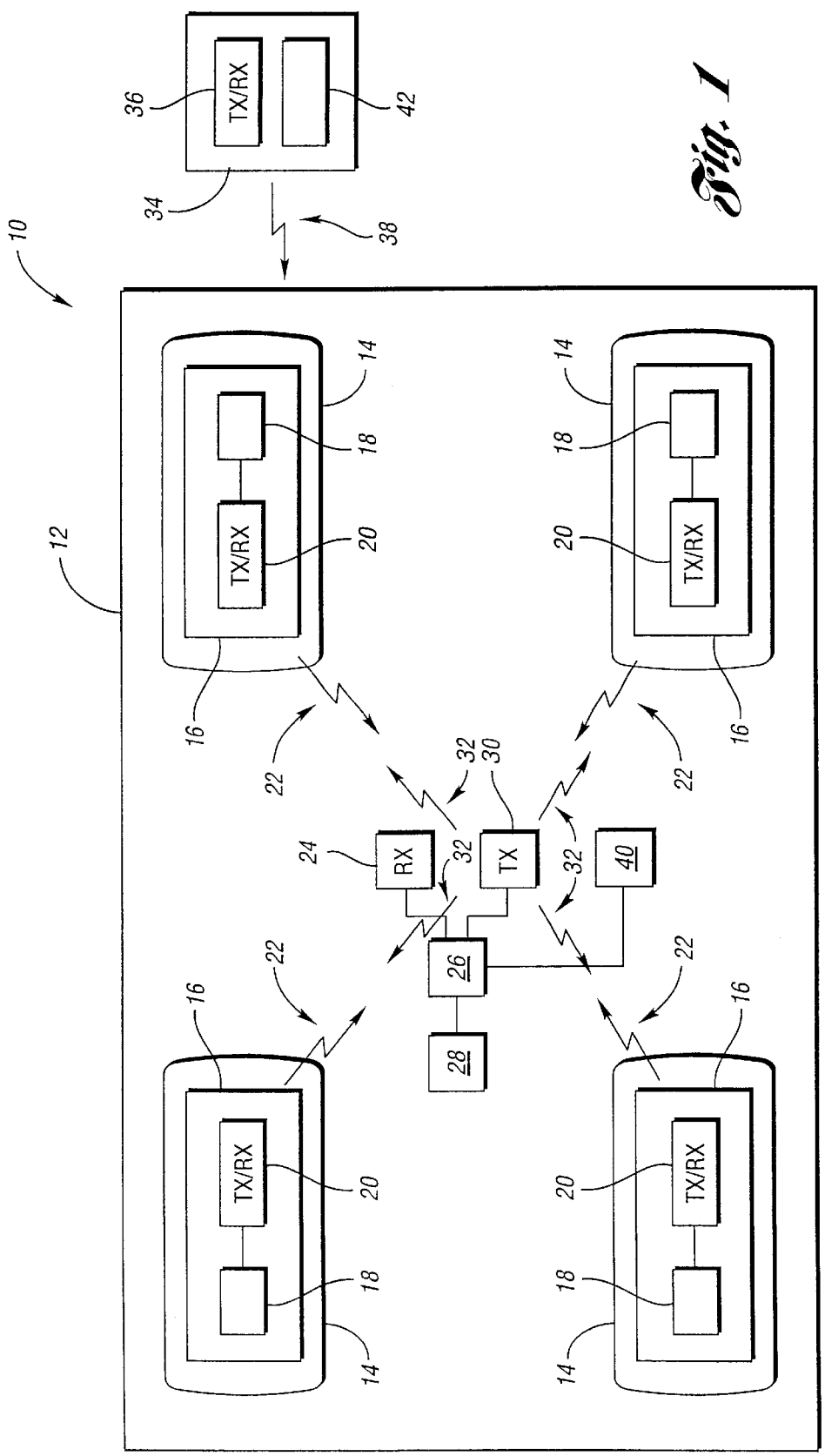
FIG. 1 is a simplified, representative block diagram of one embodiment of the system of the present invention for tire pressure monitoring and vehicle passive entry.

Referring now to FIG. 1, a simplified, representative block diagram of one embodiment of the system of the present invention for tire pressure monitoring is shown, denoted generally by reference numeral 10. As seen therein, the system (10) is designed for use in a vehicle (12) having a plurality of tires (14). It should be noted that while the present invention is described herein for use in an automotive vehicle having four tires, such an environment is exemplary only. That is, the present invention is suitable for use in any type of vehicle having any number of tires.

Still referring to FIG. 1, the system (10) includes a plurality of tire monitors (16). Each tire monitor (16) is provided for mounting in one of the plurality of tires (14). In that regard, each tire monitor (16) is preferably located inside the tire (14) adjacent the tire inflation valve stem (not shown), although any mounting location known in the art may be used. Each tire monitor (16) preferably includes an appropriate sensor (18) and/or other devices (not shown), for sensing, determining and/or monitoring at least the pressure of the associated tire (14). It should be noted, however, that each tire monitor (16) may also be equipped to sense, determine and/or monitor any number of tire parameters in addition to pressure including, but not limited to, temperature, status (i.e., whether or not the tire is rotating) and/or speed, in any fashion known in the art.

Each tire monitor (16) also preferably includes a transponder (20) in communication with sensor (18) for transmitting a tire pressure signal (22) representative of the sensed tire pressure. In that regard, tire pressure signal (22) is preferably an RF signal, although other signal types known in the art, such as low frequency (LF), could be employed. Once again, it should be noted that transponder (20) may also transmit, as part of or separate from tire pressure signal (22), a signal or signals representative of information concerning any of a number of other tire parameters in addition to pressure such as temperature, status and/or speed as sensed, measured and/or determined by an appropriately equipped tire monitor (16).

It should also be noted that each tire monitor (16) typically includes a battery (not shown), and that transponder (20) may also transmit, again as part of or separate from tire pressure signal (22), a signal or signals representative of the status of such a battery, including a low batter status, which information may also be conveyed to a vehicle occupant. As will be described in greater detail below, such tire pressure information, together with information concerning any other tire and/or battery parameters, is ultimately conveyed to a vehicle operator typically via a visual display, although audible means such as tones or speech may also be used.

Referring still to FIG. 1, the system (10) of the present invention also preferably includes at least one receiver (24) for mounting on-board the vehicle (12) for receiving the tire pressure signals (22) transmitted by transponders (20). Receiver (24) comprises one or more antenna (not shown) to be located at one or more selected sites on the vehicle (12). The system (10) further preferably comprises a controller (26) for mounting on-board vehicle (12) and to be provided in communication with receiver (24). Controller (26), which preferably takes the form of an appropriately programmed microprocessor or DSP, is for processing tire pressure signals (22) received by receiver (24) from transponders (20) in order to convey at least tire pressure information to a vehicle operator, such as by generating tire pressure information signals (not show) for use by a display unit (28).

In that regard, display unit (28) may take any form known in the art, such as an LED display or a lighted icon in the vehicle dashboard or a vehicle console, and is provided in communication with controller (26). Display (28) is for mounting inside the vehicle (12) and, as noted above, is for use by the controller (26) in conveying at least tire pressure information to the vehicle operator. Once again, as previously described, information concerning other tire parameters, such as location, temperature, status and/or speed, or battery status, may also be conveyed to the vehicle operator. It should be noted that the information may also be conveyed to the vehicle operator in an audible fashion, and may include a warning, which may also be audible, if tire pressure, other tire parameters, such as temperature, and/or battery status are outside recommended ranges.

Referring still to FIG. 1, the system (10) also preferably includes a transmitter (30) to be mounted on-board the vehicle (12) and to be provided in communication with controller (26). As will be described in greater detail below, transmitter (30) is for transmitting control signals (32) for receipt by transponders (20) in each of the monitors (16) mounted in tires (14). In that regard, the control signals (32) are for use in regulating the transmission of tire pressure signals (22) by transponders (20).

The system (10) of the present invention may still further comprise a remote passive entry device (34). Remote passive entry device (34) itself preferably comprises a transponder (36) for transmitting passive entry signals (38) for receipt by receiver (24) on-board vehicle (12). In that regard, passive entry signals (38) are preferably RF signals, although other signal types, such as LF, could also be used. Controller (26) is preferably still further provided in communication with a door locking mechanism (40) to lock or unlock a vehicle door (not shown) in response to receipt by receiver (24) of passive entry signals (38) transmitted by transponder (36) of remote passive entry device (34) within some predefined range.

In that regard, in a fashion well known in the art, remote passive entry device (34) is carried by an operator (not shown), and is designed to automatically unlock the vehicle door as the operator approaches the vehicle (12), without the need for operation of any switch or pushbutton by the operator on the remote passive entry device (34). Similarly, the system is further designed, in a fashion well known in the art, to automatically lock the vehicle door as the operator, carrying the remote passive entry device (34), moves away from the vehicle (12).

Still referring to FIG. 1, controller (26) preferably determines whether the vehicle (12) is occupied based on processing of the passive entry signals (38). In that regard, to make such a determination, controller (26) may utilize any inside/outside detection techniques, which are well known in the art, to determine whether the remote passive entry device (34) is located inside or outside of the vehicle (12). Also based on processing of the passive entry signals (38) in a fashion well known in the art, controller (26) also preferably determines whether a vehicle door (not shown) has been unlocked.

Such determinations as to whether the vehicle (12) is occupied and/or whether a vehicle door has been unlocked may be utilized according to the present invention for more efficient operation. More particularly, if controller (26) determines that the vehicle is unoccupied, controller (26) generates, for transmission to transponders (20) by transmitter (30), a control signal (32) operative to halt transmission of tire pressure signals (22) by transponders (20). In such a fashion, the life expectancy of the battery (not shown) in each of the tire monitors (16) can be extended.

Similarly, if controller (26) determines that a vehicle door has been unlocked (i.e., a user carrying the passive entry device (34) is approaching the vehicle (12)), controller (26) generates, for transmission to transponders (20) by transmitter (30), a control signal (32) operative to start transmission of tire pressure signals (22) by transponders (20). That is, controller (26) generates a control signal (32) to query tire monitors (16) immediately after allowing access to vehicle (12) such that transponders (20) begin transmission of tire pressure signals (22). In such a fashion, tire pressure monitoring begins before or immediately upon entry of vehicle (12) by a driver so that a tire (14) having, for instance, a pressure outside a recommended range can be immediately identified to the driver, even before starting vehicle (12).

According to the system (10) of the present invention, the controller (26) may additionally or alternatively be programmed to cease processing tire pressure signals (22) when it is determined that the vehicle is unoccupied. In that regard, controller (26) may also be programmed to begin processing tire pressure signals (22) when it is determined that a vehicle door has been unlocked.

Still referring to FIG. 1, as described above, remote passive entry device (34) comprises a transponder (36) for transmitting passive entry signals (38) for receipt by vehicle receiver (24). In that regard, transponder (36) is also preferably provided for receiving tire pressure information from controller (26), for example in the form of tire pressure information signals (not shown) transmitted by transmitter (30). In that same regard, remote passive entry device (34) preferably further comprises a display (42) for use in conveying tire pressure information to a user, for example through the use of such tire pressure information signals.

In such a fashion, a user may obtain tire pressure information via display (42) on passive entry device (34). That is, a user approaching the vehicle (12) carrying the remote passive entry device (34) causes a vehicle door to be unlocked. This in turn causes controller (26) to generate a control signal (32) that is transmitted by transmitter (30) to transponders (20) in tire monitors (16), which control signal (32) is operative to start transmission of tire pressure signals (22) by transponders (20). Tire pressure signals (22) are receive by receiver (24), based on which controller (26) can then provide passive entry device (34) with tire pressure information via transmitter (30) and transponder (36). Such tire pressure information is then conveyed to a user via display (42) on passive entry device (34).

As is apparent from the foregoing description, the tire pressure monitoring and passive entry functions preferably share a number of components. Preferably, as described above in detail, passive entry system components are used for querying tire pressure monitors in order to provide for more efficient operation, as well as cost savings. In that regard, RF/LF nodes and links, as well as devices such as receivers, antenna and controllers are preferably combined or integrated, thereby reducing costs. In such a fashion, programming for tire pressure monitoring and passive entry functions can also be accomplished at the same time.

In that regard, as described above, according to the present invention, a single receiver (24) is preferably provided for receiving both tire pressure signals (22) and passive entry signals (38). Alternatively, however, two receivers could be used, one for receiving tire pressure signals (22) and another for receiving passive entry signals (38). Similarly, a single controller (26) is also preferably provided, although multiple controllers could be employed for performing the tire pressure monitoring and passive entry functions described. In that regard, it should also be noted that the system (10) could alternatively employ a control unit that, in addition to the tire pressure monitoring and passive entry functions, is further equipped for and capable of performing the signal transmitting and receiving functions described in connection with transmitter (30) and receiver (24).

Similarly, although described above as preferably comprising a transponder (20), tire monitors (16) could alternatively include a transceiver or separate transmitters and receivers. The same is true for remote passive entry device (34), which could alternatively include a transceiver or a separate transmitter and receiver, rather than the transponder (36) described above. Still further, although described as a separate receiver (24) and transmitter (30), a transceiver (either separate from controller (26) or as part of a control unit) could alternatively be used.

Figure 2:
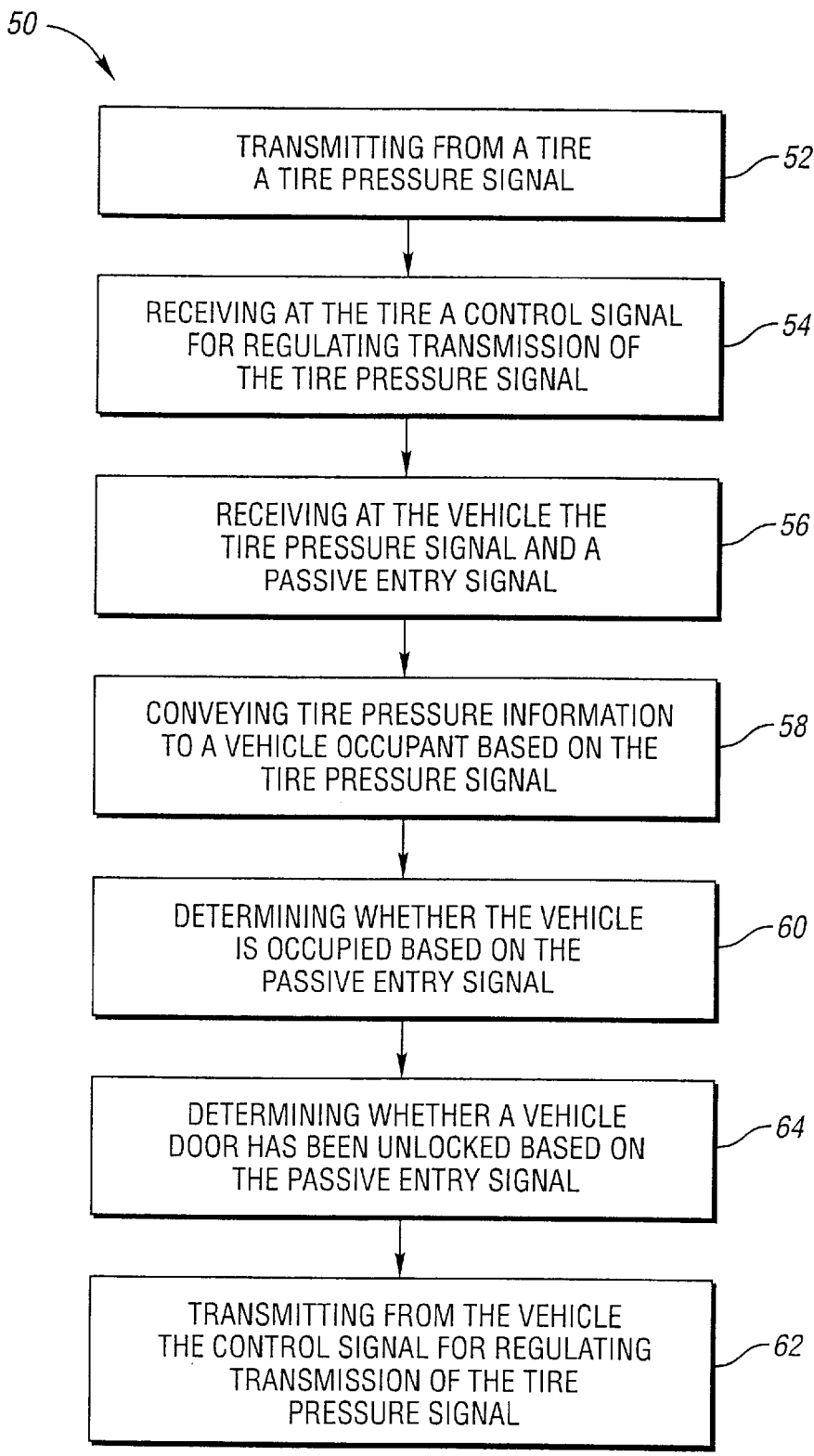
FIG. 2 is a simplified, representative flowchart of one embodiment of the method of the present invention for tire pressure monitoring and vehicle passive entry.

Referring next to FIG. 2, a simplified, representative flowchart of one embodiment of the method of the present invention for tire pressure monitoring is shown, denoted generally by reference numeral 50. As seen therein, method (50) comprises transmitting (52) from a tire a signal representative of a tire pressure, and receiving (54) at the tire a control signal for use in regulating transmission of the tire pressure signal. The method (50) further comprises receiving (56) at the vehicle the tire pressure signal and a passive entry signal, and conveying (58) tire pressure information to a vehicle occupant based on the tire pressure signal.

The method (50) still further comprises determining (60) whether the vehicle is occupied based on the passive entry signal, and transmitting (62) from the vehicle the control signal for use in regulating transmission of the tire pressure signal. In that regard, the control signal is operative to halt transmission of the tire pressure signal when the vehicle is unoccupied.

Still referring to FIG. 2, the method (50) may further comprise determining (62) if a vehicle door has been unlocked based on the passive entry signal. In that regard, the control signal is operative to start transmission of the tire pressure signal when a vehicle door has been unlocked.

As described previously in detail in connection with FIG. 1, according to the method (50) of the present invention, a monitor is preferably provided for mounting in a tire, the monitor preferably comprising a pressure sensor and a transponder for transmitting a signal representative of the sensed tire pressure and for receiving the control signal. Also according to the method (50), a control unit is preferably provided for mounting in the vehicle for receiving the tire pressure and passive entry signals, conveying the tire pressure information, and transmitting the control signal. Still further according to the method (50) of the present invention, a remote passive entry device is preferably provided for transmitting passive entry signal, the passive entry device comprising a display for conveying tire pressure information to a user It should be noted that the simplified flowchart depicted in FIG. 2 is exemplary of the method (50) of the present invention. In that regard, the method (50) may be executed in sequences other than those shown in FIG. 2, including the execution of a subset of the steps shown and/or the execution of one or more steps simultaneously.

From the foregoing description, it can be seen that the present invention provides a system and method for integrated tire pressure monitoring and passive entry that overcome the problems associated with the prior art. In that regard, as previously noted, such prior art tire pressure monitoring and passive entry systems are independent, distinct systems. That is, such systems do not interact with one another or share components. The present invention provides a system and method wherein passive entry information is utilized for regulating tire pressure monitoring, thereby improving operational efficiency. The system and method of the present invention also preferably integrate tire pressure monitoring and vehicle passive entry, such as through the use of shared, combined or integrated components, thereby reducing cost.

While various embodiments of the invention have been illustrated and described, it is not intended that these embodiments illustrate and describe all possible forms of the present invention. Rather, the words used in the specification are words of description rather than limitation, and it is understood that various changes may be made without departing from the spirit and scope of the invention. Indeed, many alternatives, modifications, and variations will be apparent to those skilled in the art in light of the foregoing description, and the present invention is intended to embrace all such alternatives.

What is claimed is:

1. A system for remote monitoring of tire pressure in a vehicle having a plurality of tires, the system comprising:

a plurality of tire monitors, each monitor for mounting in one of the plurality of tires to monitor tire pressure, each monitor comprising a transponder for transmitting a signal representative of the tire pressure and for receiving a control signal for use in regulating transmission of the tire pressure signal;

a receiver for mounting on-board the vehicle for receiving the tire pressure signals transmitted by the transponders and for receiving a passive entry signal transmitted by a remote passive entry device;

a transmitter for mounting on-board the vehicle for transmitting to the transponders the control signal for use in regulating transmission of the tire pressure signals; and a controller for mounting on-board the vehicle and to be provided in communication with the receiver and the transmitter, the controller for conveying tire pressure information to a vehicle occupant based on the tire pressure signals, determining whether the vehicle is occupied based on the passive entry signal, and generating the control signal for use in regulating transmission of the tire pressure signals, wherein the control signal is operative to halt transmission of the tire pressure signals by the transponders when the vehicle is unoccupied.

2. The system of claim 1 wherein the controller is further for determining whether a vehicle door has been unlocked based on the passive entry signal, and the control signal is operative to start transmission of tire pressure signals by the transponders when a vehicle door has been unlocked.

3. The system of claim 1 wherein the controller ceases to process tire pressure signals when the vehicle is unoccupied.

4. The system of claim 2 wherein the controller ceases to process tire pressure signals when the vehicle is unoccupied.

5. The system of claim 2 wherein the controller starts processing tire pressure signals when a vehicle door has been unlocked.

6. The system of claim 4 wherein the controller starts processing tire pressure signals when a vehicle door has been unlocked.

7. The system of claim 1 wherein the remote passive entry device comprises a transponder for transmitting the passive entry signal and receiving tire pressure information signals from the controller, and a display for conveying tire pressure information to a user based on the tire pressure information signals.

8. A system for remote monitoring of tire pressure in a vehicle having a plurality of tires, the system comprising:
- a plurality of tire monitors, each monitor for mounting in one of the plurality of tires to monitor tire pressure, each monitor comprising a transponder for transmitting a signal representative of the tire pressure and for receiving a control signal operative to regulate transmission of the tire pressure signal;
- at least one receiver for mounting on-board the vehicle for receiving the tire pressure signals transmitted by the transponders and for receiving a passive entry signal transmitted by a remote passive entry device; and
- a controller for mounting on-board the vehicle and to be provided in communication with the at least one receiver, the controller for conveying tire pressure information to a vehicle occupant based on the tire pressure signals, determining whether the vehicle is occupied based on the passive entry signal, and generating the control signal for use in regulating transmission of the tire pressure signals, wherein the control signal is operative to halt transmission of the tire pressure signals by the transponders when the vehicle is unoccupied.

9. The system of claim 8 wherein the at least one receiver comprises a single receiver for receiving both the tire pressure and passive entry signals.

10. The system of claim 8 further comprising a transmitter for mounting on-board the vehicle, the transmitter to be provided in communication with the controller, the transmitter for transmitting to the transponders the control signal operative to regulate transmission of the tire pressure signals.

11. The system of claim 8 wherein the controller is further for determining whether a vehicle door has been unlocked based on the passive entry signal, and the control signal is operative to start transmission of tire pressure signals by the transponders when a vehicle door has been unlocked.

12. The system of claim 8 wherein the controller ceases to process tire pressure signals when the vehicle is unoccupied.

13. The system of claim 11 wherein the controller ceases to process tire pressure signals when the vehicle is unoccupied.

14. The system of claim 11 wherein the controller starts processing tire pressure signals when a vehicle door has been unlocked.

15. The system of claim 13 wherein the controller starts processing tire pressure signals when a vehicle door has been unlocked.

16. The system of claim 8 wherein the remote passive entry device is provided in communication with the controller and comprises a display for conveying tire pressure information to a user.

17. A method for monitoring tire pressure in a vehicle having a plurality of tires, the method comprising:
- transmitting from a tire a signal representative of a tire pressure;
- receiving at the tire a control signal for use in regulating transmission of the tire pressure signal;
- receiving at the vehicle the tire pressure signal and a passive entry signal;
- conveying tire pressure information to a vehicle occupant based on the tire pressure signal;
- determining whether the vehicle is occupied based on the passive entry signal; and
- transmitting from the vehicle the control signal for use in regulating transmission of the tire pressure signal, wherein the control signal is operative to halt transmission of the tire pressure signal when the vehicle is unoccupied.

18. The method of claim 17 further comprising determining if a vehicle door has been unlocked based on the passive entry signal, wherein the control signal is operative to start transmission of the tire pressure signal when a vehicle door has been unlocked.

19. The method of claim 18 wherein a control unit is provided for mounting in the vehicle for receiving the tire pressure and passive entry signals, conveying the tire pressure information, and transmitting the control signal.

20. The method of claim 19 wherein a remote passive entry device is provided for transmitting the passive entry signal, the passive entry device comprising a display for conveying tire pressure information to a user.

* * * * *